United States Patent
Levinson et al.

(10) Patent No.: US 6,429,583 B1
(45) Date of Patent: Aug. 6, 2002

(54) LIGHT EMITTING DEVICE WITH $Ba_2MgSi_2O_7:Eu^{2+}$, $Ba_2SiO_4:Eu^{2+}$, OR $(Sr_xCa_yBa_{1-x-y})(Al_zGa_{1-z})_2S_R:Eu^{2+}$ PHOSPHORS

(75) Inventors: Lionel Monty Levinson, Niskayuna; Alok Mani Srivastava, Schenectady, both of NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/203,206

(22) Filed: Nov. 30, 1998

(51) Int. Cl.⁷ .............................. H01J 1/62; H01J 33/00
(52) U.S. Cl. ................. 313/503; 257/89; 252/301.4 R; 252/301.4 S
(58) Field of Search ................. 313/486, 487, 313/503; 257/99, 100, 98, 89; 252/301.4 S, 301.6 S, 301.4 R, 301.6 R

(56) References Cited

U.S. PATENT DOCUMENTS

| | | | |
|---|---|---|---|
| 5,309,070 A | * | 5/1994 | Sun et al. .................... 313/503 |
| 5,338,944 A | | 8/1994 | Edmond et al. |
| 5,416,342 A | | 5/1995 | Edmond et al. |
| 5,578,839 A | | 11/1996 | Nakamura et al. |
| 5,604,763 A | | 2/1997 | Kato et al. |
| 5,640,792 A | | 6/1997 | Smith et al. ................... 40/546 |
| 5,644,584 A | | 7/1997 | Nam et al. |
| 5,813,752 A | | 9/1998 | Singer et al. |
| 5,813,753 A | | 9/1998 | Vriens et al. |
| 5,895,932 A | | 4/1999 | Bojarczuk, Jr. et al. |
| 5,898,185 A | | 4/1999 | Bojarczuk, Jr. et al. |
| 5,998,925 A | | 12/1999 | Shimizu et al. |
| 6,066,861 A | * | 5/2000 | Hohn et al. .................... 257/99 |
| 6,234,648 B1 | * | 5/2001 | Borner et al. ................ 313/312 |
| 6,252,254 B1 | * | 6/2001 | Soules et al. ................ 257/100 |

FOREIGN PATENT DOCUMENTS

| | | |
|---|---|---|
| DE | 19638667 | 4/1998 |
| GB | 1299608 | 12/1972 |
| WO | 9819290 | 5/1998 |

OTHER PUBLICATIONS

G. Blasse, et al., *Fluorescence of $Eu^{2+}$ Activated Silicates*, 23 Phillips Res. Repts., vol. 23, pp. 189–200 (1968), Apr. 1968.

(List continued on next page.)

*Primary Examiner*—Nimeshkumar D. Patel
*Assistant Examiner*—Karabi Guharay
(74) *Attorney, Agent, or Firm*—Toan P. Vo; Noreen C. Johnson

(57) ABSTRACT

A lamp comprises a light emitting element such as a light emitting diode or a laser diode which emits blue light, and a phosphor composition which absorbs the blue light having a first spectrum from the light emitting element and emits light having a second spectrum. The phosphor composition comprises at least one of $Ba_2MgSi_2O_7:Eu_{2+}$; $Ba_2SiO_4:Eu^{2+}$; and $(Sr,Ca,Ba)(Al,Ga)_2S_4:Eu^{2+}$. The invention also relates to a light emitting element which emits blue light, and a phosphor composition which absorbs the blue light from the light emitting element having a first spectrum and emits light having a second spectrum, wherein the spectral luminous efficacy of light emitted by the lamp is at least 550 lumens per watt. The high spectral luminous efficacy of the output spectrum efficiently converts the power input to the lamp into lumens to provide a high brightness. For example the device luminous efficacy of the lamp can be 35–45 lumens output per watt of input electric power or more.

26 Claims, 3 Drawing Sheets

OTHER PUBLICATIONS

Keith H. Butler, *Fluorescent Lamp Phosphors*, Specialized Phosphors, pp. 49–60 (1980).

L. Eichenauer, et al, *Optical Characterization of Europium and Cerium in Strontium Thiogallate Thin Films and Powders*, 153 Phys. Stat. Sol., pp. 515–527 (1996).

S. Nakamura, et al, *The Blue Laser Diode* GaN Based Ligh Emitters and Lasers, pp. 216–221 Jan. (1997).

Shigeo Shionoya, et al eds, *Phosphor Handbook*, CRC Press, pp. 581–600 & 899–921 (1999).

Poort et al., "Optical Properties of Eu2+ –Activated Orthosilicates and Orthophosphates," Journal of Alloys and Compounds 260 Mar. (1977) 93–97.

Thi et al., "Investigation of the MS–Al2S3 Systems (M=Ca, Sr,Ba) and Luminescence Properties of Europium–Doped Thioaluminates," Materials Science & Engineering B B14 Feb. (1992) No. 4, 393–397.

\* cited by examiner

LIGHT EMITTING DEVICE WITH $BA_2MGSI_2O_7$:$EU^{2+}$, $BA_2SIO_4$:$EU^{2+}$, OR $(SR_XCAY BA_{1-X-Y})(AL_ZGA_{1-Z})_2S_R$:$EU^{2+}$ PHOSPHORS

BACKGROUND

1. Field of the Invention

This invention relates generally to light emitting devices, and more particularly to a lamp which produces white light from a light emitting diode and a phosphor composition.

2. Description of the Related Art

In recent years, significant improvements have been made in the fabrication of light emitting semiconductor devices which emit radiation in the shorter wavelengths. For example, Nichia Chemical Industries Ltd. in Japan has produced light emitting diodes and laser diodes which emit light in the blue and ultraviolet (UV) wavelengths. Nichia has also produced a light source which includes a blue light emitting diode (LED) and a phosphor. The phosphor, yttrium-aluminum-garnet doped with trivalent cerium, converts a portion of the blue light into a broad yellow emission. The blue and yellow light together produce white light having a color temperature of about 6000–8000° K and a color rendering index (CRI) of about 77.

The Nichia light source, however, has a device luminous efficacy of only about 5 lumens per watt of input electric power. Thus, the luminous flux output by the Nichia lamp is relatively small, particularly if the input electric power is limited, e.g. by battery power. It would be desirable, therefore, to have a light source with a higher device luminous efficacy and luminous flux output for improved performance.

SUMMARY

A lamp, according to an exemplary embodiment of the invention, comprises a light emitting element such as a light emitting diode or a laser diode which emits blue light, and a phosphor composition which absorbs the blue light having a first spectrum from the light emitting element and emits light having a second spectrum. The phosphor composition comprises at least one of $Ba_2MgSi_2O_7$:$Eu^{2+}$ $Ba_2SiO_4$:$Eu^{2+}$; and $(Sr,Ca,Ba)(Al,Ga)_2S_4$:$Eu^{2+}$.

The invention also relates to a light emitting element which emits blue light, and a phosphor composition which absorbs the blue light from the light emitting element having a first spectrum and emits light having a second spectrum, wherein the spectral luminous efficacy of light emitted by the lamp is at least 550 lumens per watt of radiant power. The high spectral luminous efficacy of the output spectrum efficiently converts the power input to the lamp into lumens to provide a high brightness. For example the device luminous efficacy of the lamp can be 35–45 lumens per watt of input electric power or more.

The lamp is particularly useful as a flashlight where brightness may be an important characteristic of the lamp, input power may be limited, and color rendering is less important.

BRIEF DESCRIPTION OF THE DRAWINGS

Other features and advantages of the invention will be apparent from the following detailed description and the accompanying drawings, in which.

DETAILED DESCRIPTION OF THE PREFERRED EMBODIMENTS

As is known in the art, the human eye is more sensitive to certain wavelengths of light than others. This phenomenon was studied carefully by the Commission International de l'Eclairage (CIE), which created a standard in 1931 known as "the standard observer" based on a large number of observations of the responses of the human eye to light. The standard observer represents the average values of eye sensitivity of a number of individuals as a function of wavelength, and has a maximum value at 555 nanometers (nm), and falls to zero at about 380 nm (ultraviolet) and 780 nm (infrared). The variable sensitivity of the human eye, as represented in the standard observer, is plotted in FIG. 1, which shows the spectral luminous efficiency $V(\lambda)$ as a function of wavelength $\lambda$.

Figure 2:
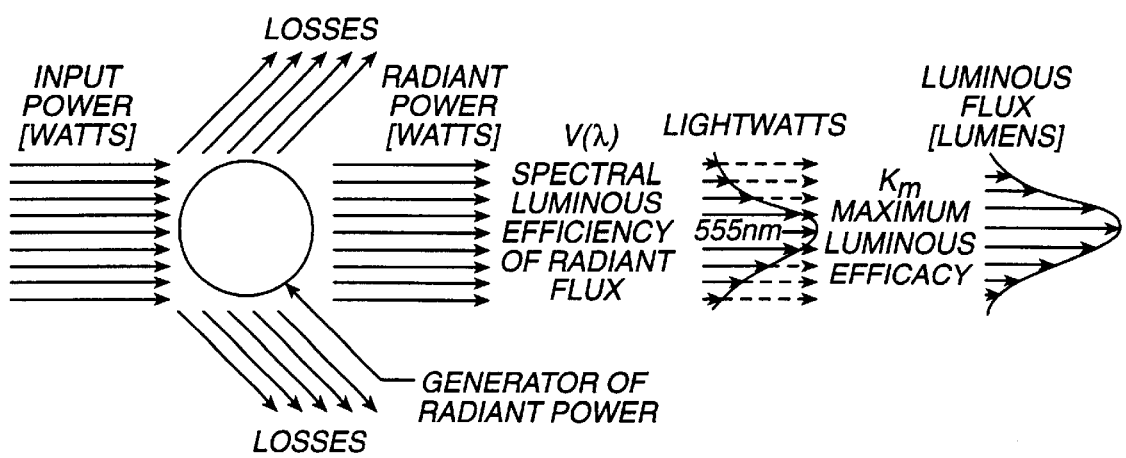
FIG. 2 is a diagram which illustrates the relationship between input power, radiant power, and luminous flux for a light source.

The spectral luminous efficiency $V(\lambda)$ is important in many lighting applications, because it can have a large effect on the luminous flux, measured in lumens, output by a light source. Luminous flux refers to the time rate of flow of radiant energy (i.e. radiant power) evaluated according to its capacity to produce visual sensation. Radiant power refers to the energy per unit time radiated by the light source. Luminous flux is different from the radiant power because of the variable sensitivity of the eye to different wavelengths of light. For example, a green light source which emits the same radiant power as red light source will have a higher luminous flux because the eye is more sensitive to green light than to red light. This principle is illustrated in FIG. 2, which shows the luminous flux as a function of wavelength produced by a radiant power spectrum which is equal for all visible wavelengths.

The luminous flux L can be calculated by integrating the product of the radiant power $P(\lambda)$ and the luminous efficiency $V(\lambda)$ over the desired wavelength range as follows:

$$k \int P(\lambda) V(\lambda) d\lambda \tag{1}$$

where the coefficient k is the maximum luminous efficacy factor, equal to 683 lumens per watt (Ipw) at 555 nm. The maximum luminous efficiency factor k converts watts into lumens.

Another variable which is commonly used in characterizing an output spectrum is the spectral luminous efficacy. The spectral luminous efficacy quantifies the effectiveness of an output spectrum at generating lumens from radiant power. The spectral luminous efficacy is conventionally defined as the luminous flux divided by the radiant power output by a light source. An output spectrum containing only the wavelength 555 nm has the greatest luminous efficacy, i.e. 683 lumens per watt. The spectral luminous efficacy of the visible light emitted by an incandescent bulb is typically about 300 lumens per watt.

Figure 1:
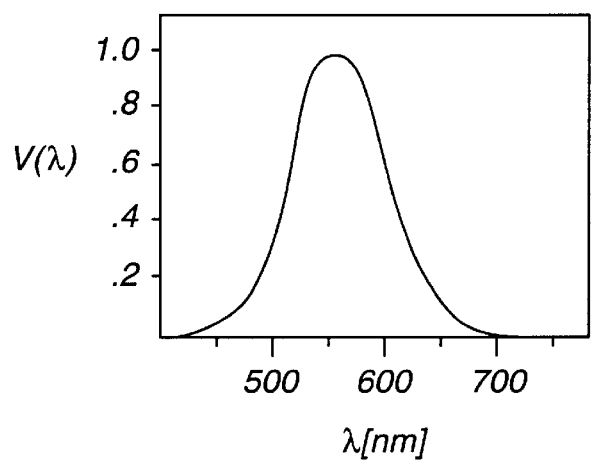
FIG. 1 is a graph of spectral luminous efficiency which shows the sensitivity of the human eye to different wavelengths of light.

According to exemplary embodiments of the invention, the output spectrum of a lamp is designed to provide a high spectral luminous efficacy by concentrating the output spectrum around the most sensitive region of the luminous efficiency curve of FIG. 1. In this way, the integral of equation (1), which represents the luminous flux output by the light source, is increased without increasing the power input to the light source.

According to exemplary embodiments of the invention, the light source comprises a light emitting device, such as an LED or a laser diode, which emits blue light and a phosphor which absorbs the blue light and emits green light. The phosphor is selected to emit green light having an output spectrum concentrated on the most sensitive region of the luminous efficiency curve of FIG. 1.

The blue light emitted by the LED typically has an emissions peak at a wavelength greater than 400, typically between 400 and 520 nm, more typically between about 450 and about 470 nm. The full width half maximum value of the blue light emitted by the LED is typically less than about 70 nm, more typically less than about 50 nm, optionally less than about 20 nm.

As is known in the art, a blue LED may be manufactured by depositing various layers of semiconductor materials on a substrate. A know group of semiconductor materials which is useful in forming light-emitting devices is the gallium nitride (GaN) system. The gallium nitride system refers to semiconductor materials comprising one or more of the group III nitrides, gallium nitride (GaN), aluminum nitride (AlN), and indium nitride (InN). The GaN system allows various wavelengths of light, particularly the shorter wavelengths, to be produced based on the relative amounts of GaN, AlN, and InN in the composition. The GaN system also typically provides the advantages of a relatively high radiant power output, and a smaller temperature sensitivity, as compared with conventional green emitting LEDs.

Figure 3:
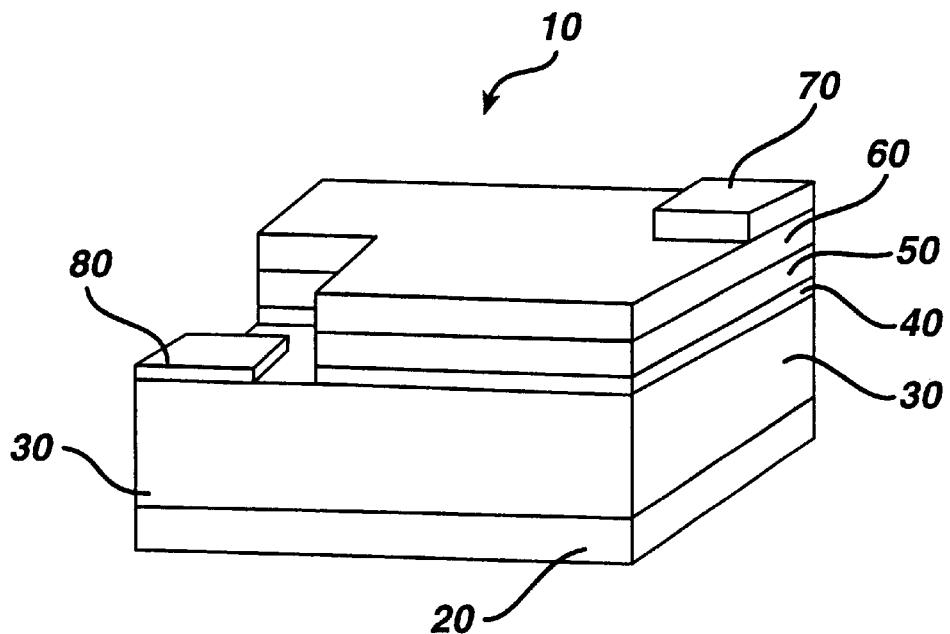
FIG. 3 is a drawing of a typical light emitting diode.

FIG. 3 illustrates an example of an LED 10. The exemplary LED includes a substrate 20, an n-type GaN layer 30, a layer 40 of indium gallium nitride (InGaN) which may form a single or multiple quantum well, a p-type aluminum gallium nitride (AlGaN) layer 50, a p-type GaN layer 60, a positive contact 70, and a negative contact 80. The various semiconductor layers 30, 40, 50, and 60 are typically deposited on one another by chemical vapor deposition (CVD). In general, each layer may comprise $In_xGa_yAl_{(1-x-y)}N$, where $0 \leq \leq 1$ and $0 \leq y \leq 1$. Although an LED is shown in FIG. 3 as an example, the invention encompasses other light emitting devices such as laser diodes. In addition, semiconductor materials other than the GaN system can be used, such as gallium arsenide (GaAs) and its alloys, silicon, and silicon carbide (SiC).

Other examples of LEDs and laser diodes which emit in the blue wavelengths are known in the art. See, for example, U.S. Pat. Nos. 5,813,753; 5,813,752; 5,338,944; 5,416,342; 5,604,763; and 5,644,584. LEDs and laser diodes which emit blue and UV radiation are also described in Shuji Nakamura and Gerhard Fasol, "The Blue Laser Diode" (1997).

Figure 4:
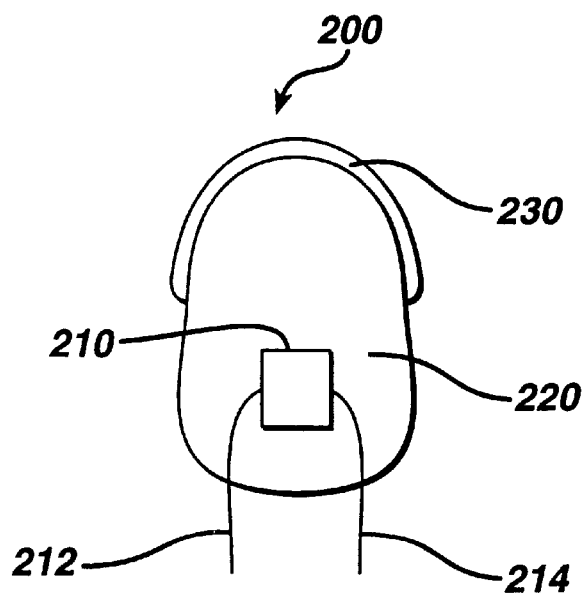
FIG. 4 illustrates a lamp which includes a phosphor composition and a light source such as a light emitting diode.

FIG. 4 illustrates a lighting apparatus according to an exemplary embodiment of the invention. The lighting apparatus 200 includes a light source 210 which may be an LED or a laser diode, for example, powered by leads 212, 214. The light source 210 and a portion of the leads 212, 214 are encapsulated within a transmissive body 220 which may comprise a silicone, glass, or plastic material, for example.

The phosphor composition 230 may be formed on an outer surface of the transmissive body 230, as shown in FIG. 4, or directly on the light source 210 within the transmissive body 230. To apply the phosphor composition to the transmissive body 230 or light source 210, the phosphor composition may be added to a liquid suspension medium, such as the nitrocellulose/butyl acetate binder and solvent solution used in commercial lacquers. Many other liquids including water with a suitable dispersant and thickener or binder, such as polyethylene oxide, can be used. The phosphor-containing suspension is painted or coated or otherwise applied on the LED and dried. The lighting apparatus 200 may also include a plurality of scattering particles, such as titanium dioxide ($TiO_2$) or aluminum oxide ($Al_2O_3$) particles, embedded in the transmissive body 230, for example if a laser diode is used as the light source 210.

Upon application of a current to the leads 212, 214, the LED produces a blue light which is converted by the phosphor composition 230 to green light. The blue light emitted by the LED or laser diode can efficiently excite the green-emitting phosphors. According to exemplary embodiments of the invention, one or more of the following phosphors are used: $Ba_2MgSi_2O_7:Eu_{2+}$; $Ba_2SiO_4:Eu^{2+}$; and $(Sr,Ca,Ba)(Al,Ga)_2S_4:Eu^{2+}$.

In the above phosphors, the element following the colon represents an activator. The notation (A,B,C) signifies ($A_x$, $B_y$, $C_z$) where $0 \leq x \leq 1$ and $0 \leq y \leq 1$ and $0 \leq z \leq 1$ and $x+y+z=1$. For example, (Sr,Ca,Ba) signifies ($Sr_x$,$Ca_y$,$Ba_z$) where $0 \leq x \leq 1$ and $0 \leq y \leq 1$ and $0 \leq z \leq 1$ and $x+y+z=1$. Typically, x, y, and z are all nonzero. The notation (A,B) signifies ($A_x$,$B_y$) where $0 \leq x \leq 1$ and $0 \leq y \leq 1$ and $x+y=1$. Typically, x and y are both nonzero.

Figure 5:
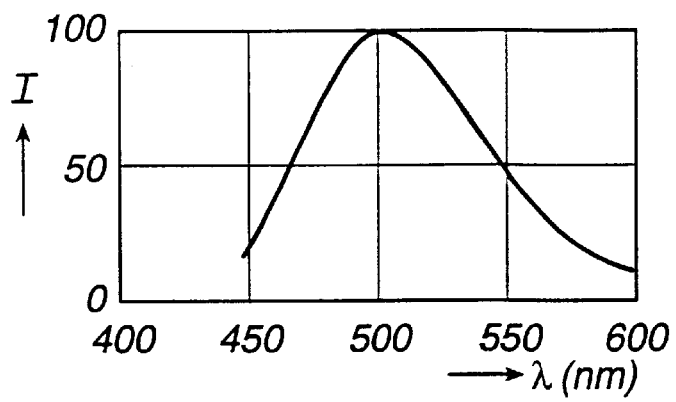
FIG. 5 is a graph of the emission spectrum of the phosphor $Ba_2MgSi_2O_7$:$Eu_{2+}$.
Figure 6:
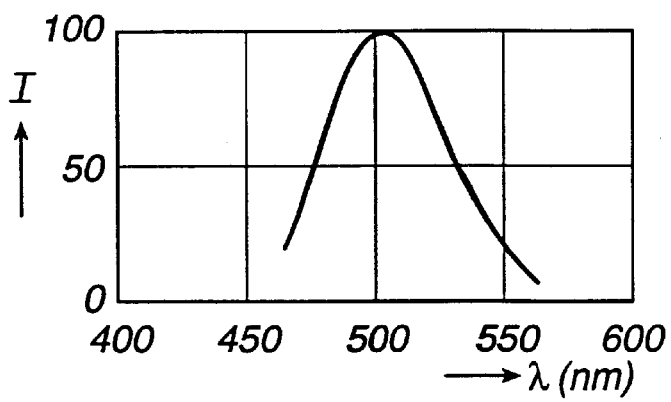
FIG. 6 is a graph of the emission spectrum of the phosphor $Ba_2SiO_4$:$Eu^{2+}$.
Figure 7:
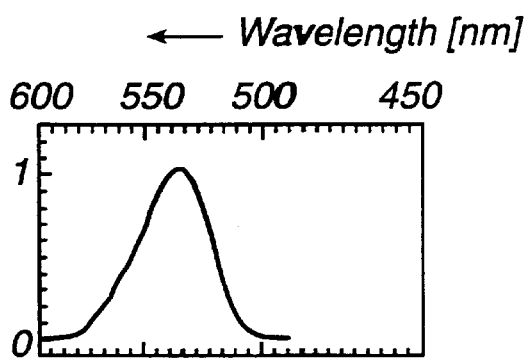
FIG. 7 is a graph of the emission spectrum of the phosphor $(Sr,Ca,Ba)(Al,Ga)_2S_4$:$Eu^{2+}$ where the amount of Ca, Ba, and Al is zero.

The green emitting phosphors preferably have peak emissions between about 500 nm and about 555 nm. FIGS. 5, 6, and 7 show the emission spectra for the three green phosphors disclosed herein. As shown in the Figures, the emission spectra of the green phosphors coincide to a large extent with the most sensitive region of the spectral luminous efficacy curve of FIG. 1. For example, $Ba_2MgSi_2O_7:Eu^{2+}$ has a peak emission at about 495–505 nm, typically about 500 nm, $Ba_2SiO_4:Eu^{2+}$ has a peak emission at about 500–510 nm, typically where the amount of Ca, Ba, and Al is zero, has a peak emission at about 535–545 nm, typically about 540 nm. The resulting spectral luminous efficacy of the lamp using one or more of these phosphors, assuming substantially all of the blue light is absorbed by the phosphor, is typically greater than 550 lumens per watt of radiant power.

Another variable which is commonly used to describe the effectiveness of a lamp at generating lumens is the device luminous efficacy, defined as the luminous flux output by the lamp divided by the electric power input to the lamp. The device luminous efficacy of the lamp takes into account the spectral luminous efficacy of the output spectrum as well as three additional factors. First, the device efficiency represents the radiant power output by the LED divided by the electric power input to the LED. For a typical blue LED, the device efficiency is about 10%. Second, the quantum efficiency of the phosphor represents a loss associated with the transfer of energy from the absorbed photons to the emitted photons. The quantum efficiency is defined as the number of photons emitted by the phosphor divided by the number of photons absorbed by the phosphor. For the phosphors described herein, the quantum efficiency is typically about 80%. Third, there is an energy loss associated with the decrease in frequency of the emitted light affected by the phosphor equal to $h\Delta v$, where h is Plank's constant and $\Delta v$ is the change in frequency of the light. For light absorbed at 450 nm and emitted at 555 nm, the emitted energy is 450/555=81% of the absorbed energy.

Taking into account all of these factors, the device luminous efficacy (DLE) for a typical lamp is:

$$DLE=(DE)*(QE)*(FL)*(SLE)$$

where DE=device efficiency, QE=phosphor quantum efficiency, FL=frequency loss efficiency, and SLE=spectral luminous efficacy. For a typical lamp according to exemplary embodiments of the invention, the device luminous efficacy is (10%) * (80%) * (81%) * (550 to 683 lumens per watt of radiant power)=about 35–45 lumens per watt of input electric power. This range of device luminous efficacy represents a significant increase over known LED lamps. For example, conventional green-emitting LEDs typically produce no more than 30 lumens per watt (lpw) of input electric power.

According to another embodiment of the invention, the device luminous efficacy can be increased still further by utilizing a laser diode, which may have a device efficiency of 40%, for example. Assuming the other variables remain substantially the same, the device luminous efficacy is increased to about 143–177 lumens per watt of input electric power.

Using either the LED or the laser diode as a light source, the output light has a spectrum which is concentrated around the most sensitive region of the spectral luminous efficiency curve of FIG. 1, producing a high spectral luminous efficacy, e.g. at least 550 lpw. The invention thus provides the advantage of a significantly increased luminous flux output without any increase in the electric power input to the LED or laser diode.

Other embodiments of the invention will be apparent to those skilled in the art from a consideration of this specification or practice of the invention disclosed herein. It is intended that the specification and examples be considered as exemplary only, with the true scope and spirit of the invention being defined by the following claims.

What is claimed is:

1. A lamp comprising:
    a light emitting element which emits blue light; and
    a phosphor composition disposed in relation to the light emitting element such that the phosphor composition receives and absorbs the blue light having a first spectrum from the light emitting element and emits light having a second spectrum, the phosphor composition comprising at least one of $Ba_2MgSi_2O_7:Eu^{2+}$; $Ba_2SiO_4:Eu^{2+}$; and $(Sr,Ca,Ba)(Al,Ga)_2S_4:Eu^{2+}$.

2. The lamp of claim 1, wherein the light emitting element comprises a light emitting diode.

3. The lamp of claim 1, wherein the light emitting element comprises a laser diode.

4. The lamp of claim 1, wherein the second spectrum has a spectral luminous efficacy of at least 550 lumens per watt of radiant power.

5. The lamp of claim 1, wherein the lamp has a device luminous efficacy of at least 35 lumens per watt of input electric power.

6. The lamp of claim 1, wherein the blue light has an emission peak at a wavelength greater than 400 nm and less than 520 nm.

7. The lamp of claim 1, wherein the blue light has an emission peak between 450 nm and 470 nm.

8. The lamp of claim 1, wherein the second spectrum has an emission peak between 500 nm and 570 nm.

9. The lamp of claim 1, further comprising a transmissive body which encapsulates the light emitting element, wherein the phosphor composition is deposited on a surface of the transmissive body.

10. The lamp of claim 1, wherein the phosphor composition comprises $(Sr,Ca,Ba)(Al,Ga)_2S_4:Eu^{2+}$.

11. A lamp comprising:
    a light emitting element which emits blue light; and
    a phosphor composition which absorbs the blue light from the light emitting element having a first spectrum and emits light having a second spectrum, wherein the spectral luminous efficacy of light emitted by the lamp is at least 550 lumens per watt of radiant power.

12. The lamp of claim 11, wherein the light emitting element comprises an LED.

13. The lamp of claim 11, wherein the lamp has a device luminous efficacy of at least 35 lumens per watt of input electric power.

14. The lamp of claim 11, wherein the light emitting element comprises a laser diode.

15. The lamp of claim 11, wherein the second spectrum has an emission peak between 535 nm and 545 nm.

16. The lamp of claim 11, wherein the second spectrum has an emission peak between 495 nm and 510 nm.

17. The lamp of claim 11, wherein the second spectrum has an emission peak between 500 nm and 510 nm.

18. A lamp comprising:
    a light emitting element which emits blue light; and
    a phosphor composition which absorbs the blue light from the light emitting element having a first spectrum and emits light having a second spectrum, wherein the spectral luminous efficacy of light emitted by the lamp is at least 550 lumens per watt of radiant power and wherein the phosphor composition comprises at least one of: $Ba_2MgSi_2O_7:Eu^{2+}$; $Ba_2SiO_4:Eu^{2+}$; and $(Sr,Ca,Ba)(Al,Ga)_2S_4:Eu^{2+}$.

19. A lamp comprising:
    a light emitting element which emits blue light: and
    a phosphor composition which absorbs the blue light from the light emitting element having a first spectrum and emits light having a second spectrum, wherein the device luminous efficacy of the lamp is at least 35 lumens per watt of input electric power.

20. The lamp of claim 19, wherein the spectral luminous efficacy of light emitted by the lamp is at least 550 lumens per watt of radiant power.

21. A method of producing light comprising the steps of:
    generating blue light with a light emitting device;
    directing the blue light to a phosphor composition which absorbs the blue light, the phosphor composition comprising at least one of: $Ba_2MgSi_2O_7:Eu$ ; $Ba_2SiO_4:Eu^{2+}$; and $(Sr,Ca,Ba)(Al,Ga)_2S_4:Eu^{2+}$; and
    converting the blue light with the phosphor composition to light having a different spectrum.

22. The method of claim 21, wherein the step of generating blue light comprises generating blue light with a light emitting diode.

23. The method of claim 22, wherein the phosphor composition converts the blue light to light having a spectral luminous efficacy of at least 550 lumens per watt of radiant power.

24. A method of producing light comprising the steps of:
    generating blue light with a light emitting device; and
    absorbing the blue light with a phosphor composition which emits light of a different spectrum such that the light emitted by the light emitting device and phosphor composition together has a spectral luminous efficacy of at least 550 lumens per watt of radiant power.

25. A lamp comprising:

a light emitting element which emits blue light, and a phosphor composition which absorbs the blue light having a first spectrum from the light emitting element and emits light having a second spectrum, the phosphor composition comprising $Ba_2MgSi_2O_7:Eu^{2+}$.

26. A lamp comprising:

a light emitting element which emits blue light; and a phosphor composition which absorbs the blue light having a first spectrum from the light emitting element and emits light having a second spectrum, the phosphor composition comprising $Ba_2SiO_4:Eu^{2+}$.

* * * * *